(12) United States Patent
Moriuchi et al.

(10) Patent No.: US 8,092,263 B2
(45) Date of Patent: Jan. 10, 2012

(54) PROCESS FOR PRODUCING CONNECTOR AND CONNECTOR PRODUCED BY THE SAME PROCESS

(75) Inventors: Hiroyuki Moriuchi, Utsunomiya (JP); Yoshihiro Tadokoro, Oyama (JP); Eiichi Mikogai, Moka (JP); Yoshiichi Nakano, Moka (JP)

(73) Assignee: DDK Ltd., Tokyo (JP)

( * ) Notice: Subject to any disclaimer, the term of this patent is extended or adjusted under 35 U.S.C. 154(b) by 0 days.

(21) Appl. No.: 12/452,523

(22) PCT Filed: Jul. 7, 2008

(86) PCT No.: PCT/JP2008/062644
§ 371 (c)(1),
(2), (4) Date: Mar. 23, 2010

(87) PCT Pub. No.: WO2009/008526
PCT Pub. Date: Jan. 15, 2009

(65) Prior Publication Data
US 2010/0255735 A1   Oct. 7, 2010

(30) Foreign Application Priority Data

Jul. 6, 2007 (JP) ................................. 2007-177867

(51) Int. Cl.
*H01R 13/03* (2006.01)
(52) U.S. Cl. .............................................. 439/886
(58) Field of Classification Search ................ 439/886, 439/887, 878; 428/646, 670, 673, 929
See application file for complete search history.

(56) References Cited

U.S. PATENT DOCUMENTS

| 5,007,092 A | 4/1991 | Galand |
| 2004/0053019 A1* | 3/2004 | Yamamoto et al. ........... 428/209 |
| 2005/0106408 A1 | 5/2005 | Szuchain |

FOREIGN PATENT DOCUMENTS

| JP | 56-41397 | 4/1981 |
| JP | 2001-267440 | 9/2001 |
| JP | 2004-197224 | 7/2004 |
| JP | 2004-292944 | 10/2004 |
| JP | 2006-127939 | 5/2006 |
| JP | 2006-137184 | 6/2006 |

(Continued)

OTHER PUBLICATIONS

English Translation of SIPO Office Action, Apr. 26, 2011.

(Continued)

*Primary Examiner* — Alexander Gilman
(74) *Attorney, Agent, or Firm* — Farjami & Farjami LLP

(57) ABSTRACT

An object of the invention is to provide a process for providing a connector, which prevents component atoms constituting a material and a substrate layer from diffusing into a tin-containing material layer and suppressing an occurrence of external force-type whiskers upon the application of external force to a surface of the tin-containing material layer, and a connector produced by the same process. In a production process of a connector comprising a step of providing a substrate layer on a surface of the material to surface treat the material and a step of providing a tin-containing material layer on an upside of the substrate layer to surface treat the substrate layer, the object can be achieved by further comprising a step of providing a barrier intermediate layer before the provision of the tin-containing material layer.

19 Claims, 14 Drawing Sheets

FOREIGN PATENT DOCUMENTS

| | | |
|---|---|---|
| JP | 2006-161155 | 6/2006 |
| JP | 2006-281453 | 10/2006 |
| JP | 2006-295114 | 10/2006 |
| JP | 2007-9305 | 1/2007 |
| JP | 2007-53039 | 3/2007 |
| JP | 2007-88211 | 4/2007 |
| JP | 2007-103586 | 4/2007 |
| JP | 2007-115925 | 5/2007 |

OTHER PUBLICATIONS

Office Action from SIPO in Original Chinese Language, Apr. 26, 2011.

* cited by examiner

FIG. 1
(A) 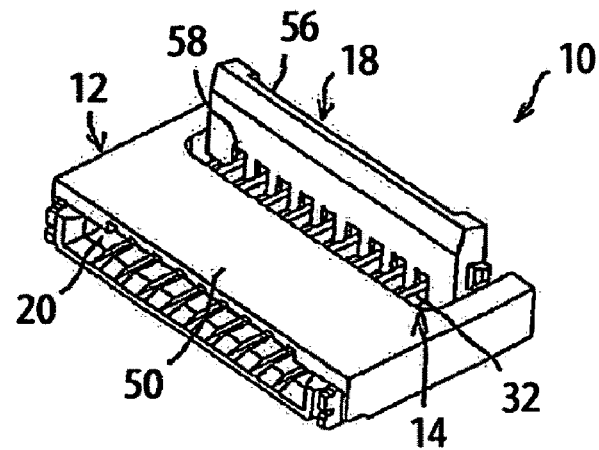
(B) 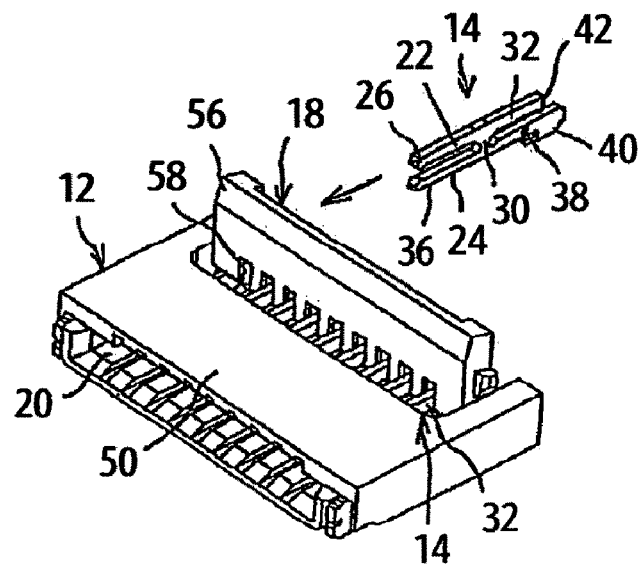
(C) 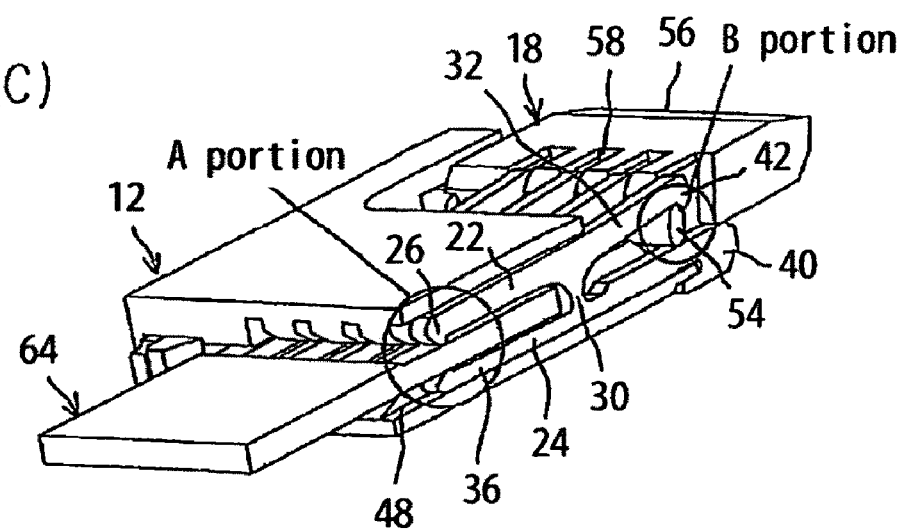

FIG. 3
(A) Whisker
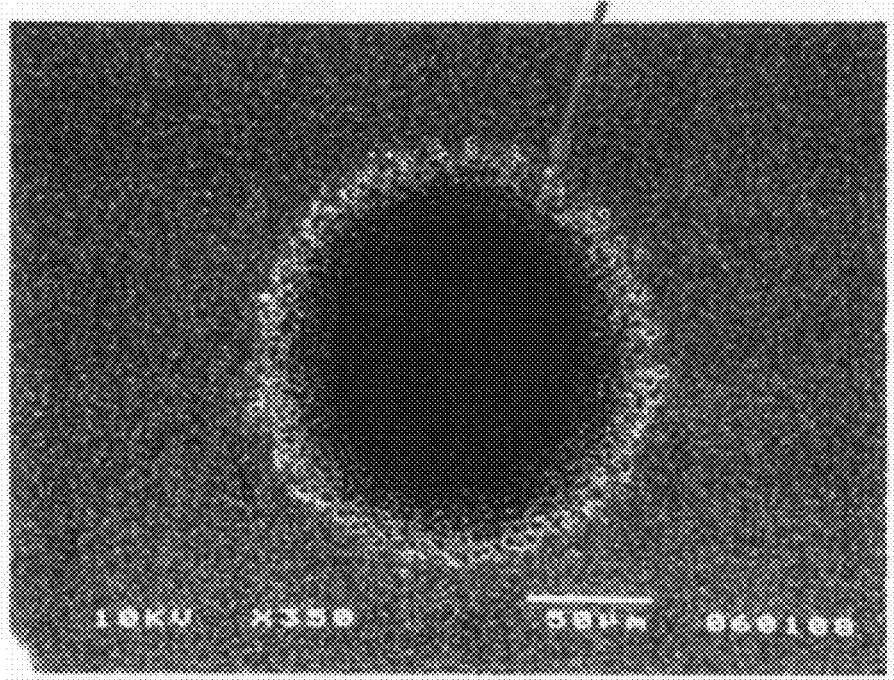
(B) Whisker
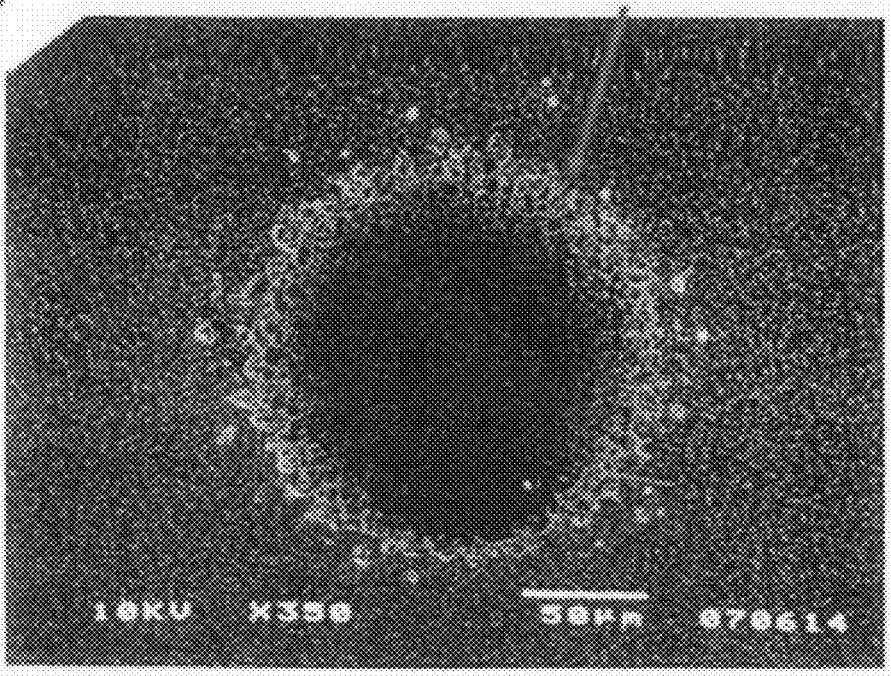

FIG. 4
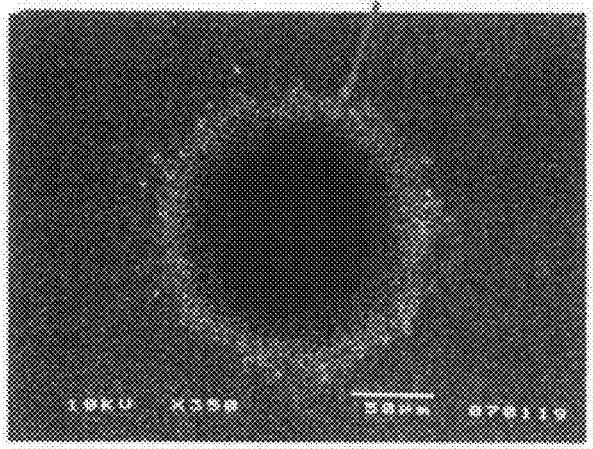
(A) Whisker
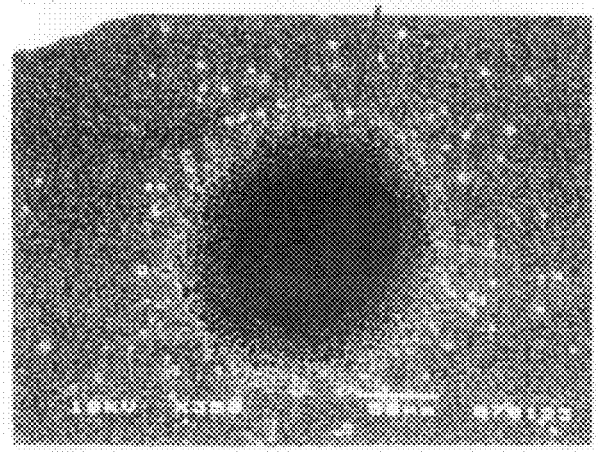
(B) Whisker
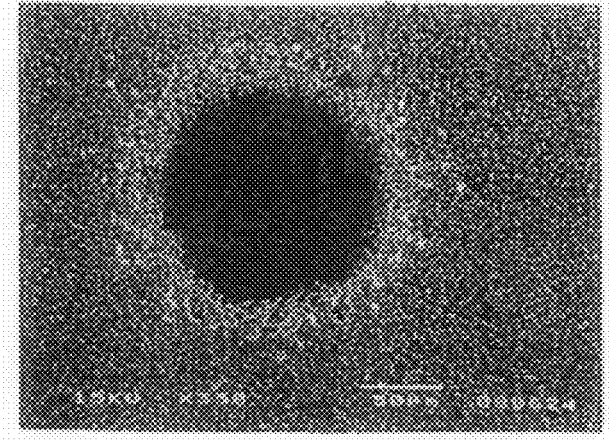
(C) Whisker

Table 1 (Occurrence state of whiskers)

| Sample No. | Sample 5 | Sample 6 | Sample 7 |
|---|---|---|---|
| Thickness of barrier intermediate layer (μm) | 0.03 | 0.05 | 0.1 |
| Occurrence state of whiskers | ○ | ○ | ○ |

○ : Great effect of suppressing whiskers
△ : Medium effect of suppressing whiskers
✕ : No effect of suppressing whiskers (B)

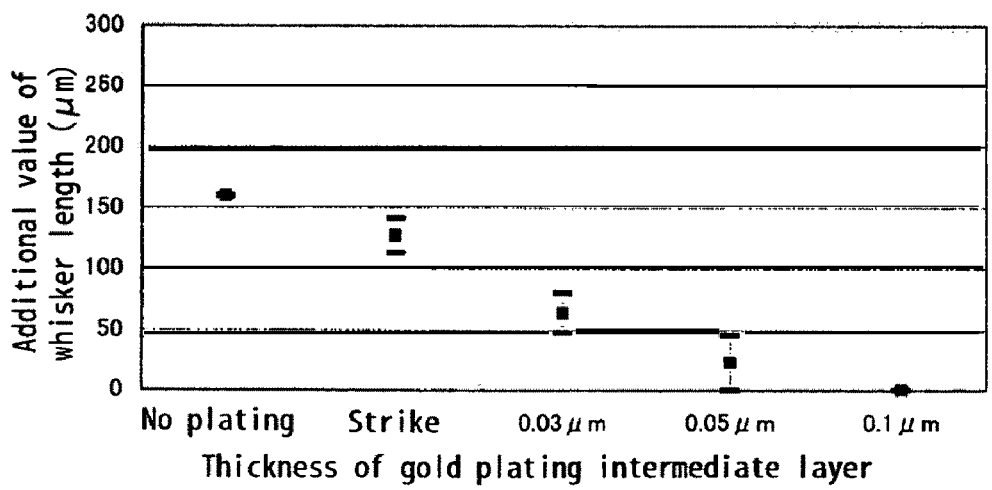

※Graph showing additional value of whisker length
(with addition of not less than 10μm of whisker length)

FIG. 9

X portion
Whisker

Sn-Ag
Ni
material (B)
Y portion

FIG. 10
(A)
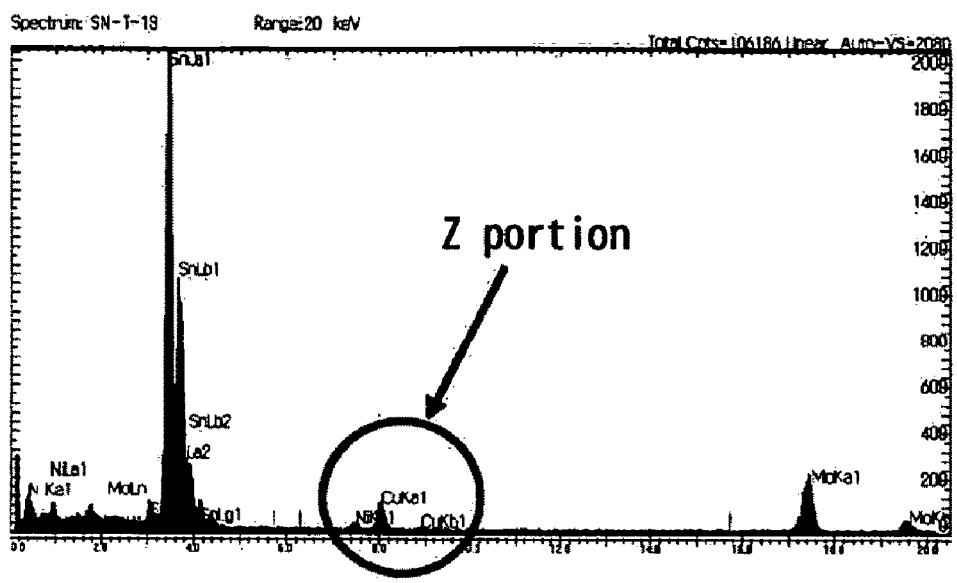
(B)
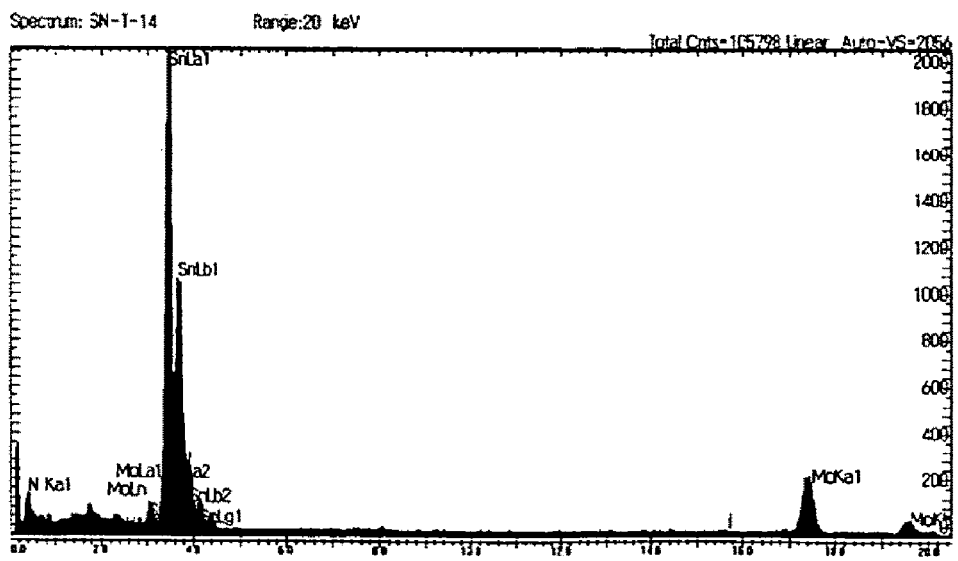

(A)

Qualitative analysis result of area B by TEM-EDS method of Sn plating (B)

Quantative analysis result of area B by TEM-EDS method of Sn plating

| Element | Line | Weight % | Cnts/s | Atomic % |
|---------|------|----------|--------|----------|
| Ni | Ka | 1.11 | 8.39 | 2.46 |
| Cu | Ka | 2.11 | 14.10 | 4.31 |
| Sn | La | 67.78 | 342.66 | 74.13 |
| Au | La | 29.00 | 107.57 | 19.11 |

(A)

Qualitative analysis result of area B by TEM-EDS method of Sn plating (B)

Quantative analysis result of area B by TEM-EDS method of Sn plating

| Element | Line | Weight % | Cnts/s | Atomic % |
|---------|------|----------|--------|----------|
| Ni | Ka | 25.68 | 193.27 | 43.74 |
| Cu | Ka | 5.19 | 34.56 | 8.16 |
| Sn | La | 38.88 | 195.88 | 32.75 |
| Au | La | 30.25 | 111.85 | 15.36 |

PROCESS FOR PRODUCING CONNECTOR AND CONNECTOR PRODUCED BY THE SAME PROCESS

This is a U.S. national phase application which is based on, and claims priority from, PCT application Serial No. PCT/JP2008/062644, filed on Jul. 7, 2008, which claims priority from foreign application Serial No. 2007-177867, filed on Jul. 6, 2007 in Japan.

TECHNICAL FIELD

This invention relates to a connector for use within electronic devices and electric instruments, particularly to a process for producing a connector, which suppresses the occurrence of whiskers upon the application of external force when a terminal of metal for use in the connector is subjected to surface treatment.

BACKGROUND ART

A terminal for use in a connector is normally subjected to surface treatment for corrosion resistance and endurance. As the surface treatment, first, substrate plating is applied, and upper layer plating is further applied thereon. The upper layer plating is selected accordingly based on the use application at a terminal portion. For example, for use at a contact portion with an object, gold-containing material plating, silver plating, tin-containing material plating and the like are cited considering connection stability and cost. Moreover, for use at a connecting portion with a board and the like, gold-containing material plating, tin-containing material plating and the like are cited considering soldering property, environmental issue and cost.

First, patent documents 1, 2, 3 and 4 will be presented as documents of suppressing the occurrence of whiskers.

Next, patent documents 5, 6, 7, 8 and 9 will be presented as of multilayer surface treatment.

Patent Document 1: Japanese Patent Application Laid-open No. 2006-127,939

According to the summary of patent document 1, it is disclosed that in an electric conductor component such as a lead-free tin plated flat cable, with an object of providing an electric conductor component preventing the occurrence of whiskers at a portion receiving external stress and a production process of the same, tin plating 2 with a thickness of from 0.2 µm to less than 1.0 µm is applied to an electric connecting portion, the tin plating is heat treated to have a ratio of an alloy layer 4 of tin of the tin plating 2 and an electric conductor 1 of not less than 50%, not less than 1.0% of bismuth is also added to the tin plating 2 to enhance solder wettability, nickel plating 5 with a thickness of 0.1 µm to 2.0 µm as a substrate metal is applied to prevent oxidation degradation of the electric conductor, and further a sealing agent is applied to the tin plating 2 to enhance the reliability of electric connection.

Patent Document 2: Japanese Patent Application Laid-open No. 2004-292,944

According to the summary of patent document 2, it is disclosed that with an object of providing a metal material of an electric component for semiconductor preventing the occurrence of whiskers, when an Sn plating layer is provided on a surface of the metal material of an electric component, 0.5 to 5 µm of Ni is plated and 0.5 to 5 µm of Cu is further plated thereon as a substrate.

Patent Document 3: Japanese Patent Application Laid-open No. 2007-53,039

According to the summary of patent document 3, it is disclosed that with an object of providing a connecting structure of an electric connector capable of suppressing whiskers occurred due to external stress added to a connecting portion by applying tin-based plating containing silver to a contact portion where a connector and a flexible wiring board are bonded, a connecting structure of an electric connector for a flexible wiring board 1 comprises a connecting hole for inserting a connecting portion of the flexible wiring board 1 therein, a plurality of metal terminals 8 loaded in a terminal loading space formed toward inside of a housing 7 of an electric connector 6 from the connecting hole, a separating wall for electrically separating between the metal terminals so that the adjacent metal terminals 8 do not contact, and a conductive layer 4 portion where metal terminals of the electric connector 6 are pressure contacted with the connecting portion of the flexible wiring board 1, and a tin layer containing silver with a predetermined thickness is formed on a copper pattern with a predetermined thickness in the conductive layer 4 portion.

Patent Document 4: Japanese Patent Application Laid-open No. 2007-103,586

According to the summary of patent document 4, it is disclosed that with an object of providing a process for producing a wiring circuit board capable of suppressing the occurrence of whiskers, ensuring connectivity with an electric component and reducing variation of the connectivity, a wiring pattern 12 of a metal thin film 31 and a conductor layer 33 is formed on a base insulating layer BIL, an electroless tin plating layer 34 is formed so as to cover the wiring pattern 12, and the wiring pattern 12 and the tin plating layer 34 are subjected to heat treatment here. A mixed layer 35 of copper and tin is formed by the heat treatment with a heat treating temperature of 175 to 225° C. and a heat treating time of 2 to 10 minutes, thereafter a solder resist SOL is formed so as to cover the wiring pattern 12 and the tin plating layer 34 in a predetermined area on the base insulating layer, and then the solder resist SOL is subjected to thermal curing treatment.

Patent Document 5: Japanese Patent Application Laid-open No. 2006-161,155

According to the summary of patent document 5, it is disclosed that when a 4 layer plated film of zinc, copper, nickel and aluminum is formed on a magnesium alloy and the configuration of the plated matter is complexified, a film having 3 layers of nickel, copper and aluminum in order from magnesium alloy side is formed on the magnesium alloy by a plating method and further a portion of the aluminum layer on the surface is anodized to solve the problem that the adhesion of the entire film decreases after aluminum plating due to internal stress of nickel plated film. By forming the copper plated film between the nickel plated film and the aluminum plated film as a stress relaxation layer, the internal stress generated in the nickel plated film and the aluminum plated film is relaxed and the adhesion of the entire film is enhanced.

Patent Document 6: Japanese Patent Application Laid-open No. 2006-295,114

According to the summary of patent document 6, it is disclosed that with an object of providing a board for an electronic device capable of pulling a core board away from the board for an electronic device side with weak force, reducing load of a chemical or electrochemical solution method or mechanical abrasive operation for exposing an electrode plane to a lower plane, and further downsizing, a production process of the same, the electronic device and a production process of the same, a photo solder resist (PSR) film 102 where an electric component is loaded is formed on a core board 101 of metal, a plurality of metal electrodes 110 of 3 layers of a gold plated film 104, a nickel plated film 105 and a gold plated film 106 is formed at a predetermined position inside of the PSR film 102 so as to penetrate the PSR film 102 in a thickness direction, and the core board 101 is chemically dissolved and removed by injection of ferric chloride solution at the final step of producing an electronic device.

Patent Document 7: Japanese Patent Application Laid-open No. 2007-9,305

According to the summary of patent document 7, in a terminal of 3 layer plated film of an electroless nickel plated film, an electroless palladium plated film and an immersion gold plated film, a gold plated film is formed by only immersion gold plating which is easy to use to provide an electroless palladium plating solution having an excellent bonding strength in both wire bonding and solder ball and also being excellent in running property even when an electroless nickel-phosphorous with high versatility is used, and a problem is solved by an electroless palladium plating solution containing at least components (a) a palladium salt organic complex, (b) a monocarbonic acid having a sulfide group or its salt and (c) a hypophosphorous acid or its salt.

Patent Document 8: Japanese Patent Application Laid-open No. 2007-88,211

According to the summary of patent document 8, it is disclosed that with an object of providing an implementable lead frame having wire bondability and using lead-free solder, wherein the reliability of the semiconductor device is maintained without deteriorating the adhesion between the lead frame and resin for resin sealing of the semiconductor device and the adhesion is improved without receding roughening effect in a surface of the lead frame of 3 layers subjected to roughening such as blast, and a production process of the same, a lead frame for lead-free soldering has a layer composition of a nickel plated film on a metal sheet surface, a palladium plated film on the nickel plate surface and a gold plated film on the surface thereof provided in order, a layer thickness of the nickel plated film is not uniform, each layer thickness of the palladium plated film and the gold plated film is uniformly formed, and the nickel plated film with the nonuniform layer thickness is subjected to wet blast on the surface and roughened to enhance the adhesion strength with the sealing resin.

Patent Document 9: Japanese Patent Application Laid-open No. 2007-115,925

According to the summary of patent document 9, it is disclosed that with an object of providing a plated lead frame of steadily wetting with lead-free solder even with a small outer lead pitch, a 4 layer plating of substrate plating (Ni) 10, palladium plating 11, silver plating 12 and gold plating 13 in order from the bottom layer is applied to a lead frame material 9.

Although gold-containing material plating having good connection stability has been used for a contact portion with an object, tin-containing material plating has come to be used as FIG. 7 in consideration of cost and environmental issues (it is possible to obtain enough connection stability not to cause a problem).

There has been a problem that with the tin-containing material plating, whiskers occur as FIG. 8 when an external force is added to a contact portion with an object where the external force should be added. If the whiskers occur, when the space between adjacent terminals is narrow, a short circuit occurs between the adjacent terminals, which causes poor connection.

Although multilayer surface treatment such as the patent documents 5 to 9 is disclosed, there is not one that a barrier intermediate layer for preventing the components of alloy and plating from diffusing into the top layer plating is provided. Moreover, there is not one that the whisker suppressing method cited in the patent documents 1 to 4 is conducted by the barrier intermediate layer for preventing the components of alloy and plating from diffusing into the top layer plating.

The inventors have analyzed a whisker portion in order to determine the cause of an occurrence of whiskers. A result is that nickel plating (approximately not less than 2 μm) as a substrate is applied to a material of copper alloy and a tin-containing material plating (approximately not less than 1.5 μm) is further applied thereto.

As seen from FIGS. 9 and 10, it is clear that the whisker portion contains copper and nickel as components other than tin. It can be thought that the growth of whiskers is furthered by diffusion of copper, which is a component in the copper alloy as the material, and nickel, which is a component in the nickel plating, into the tin-containing material plating. FIG. 9 (A) is a cross-sectional view (photograph) of a whisker occurred portion observed from a cross-sectional direction, (B) is an enlarged view of X portion of (A). The view (photograph) of FIG. 9 is a transmission electron image. An elemental analysis is conducted on points 1 and 2 covered with Y portion in FIG. 9 (B) by EDX (energy dispersive elemental X-ray spectroscopy). Point 1 of Y portion is a precipitate (inclusion) seen as black in the view and point 2 of Y portion is an area without precipitate. FIG. 10 (A) is an analysis result of point 1 and (B) is an analysis result of point 2. In FIG. 10 (A), copper (Cu) and nickel (Ni) are detected other than tin (Sn) as Z portion. However, nothing other than tin (Sn) is detected in point 2 as FIG. 10 (B). This shows that the above mentioned is clear.

Moreover, as shown in FIG. 11, a tin (Sn) crystal at the root in the whisker occurred portion is coarsened. This can be presumed that upon the application of external force to the tin-containing material layer, tin atoms tend to diffuse in a certain direction through an interfacial portion between the tin-containing material layer and a substrate layer and a tin plating grain boundary (grain boundary diffusion and intra-particle diffusion), since the diffusion of tin (Sn) atoms is concentrated on a certain tin (Sn) crystal particle, it is coarsened.

It can be thought that the 2 causes mentioned above (diffusion of copper (material) and nickel (substrate plating) into tin-containing material plating and coarsening of a certain crystal particle by diffusion of tin (Sn) atoms being concentrated thereon) correlatively further the occurrence of whiskers.

DISCLOSURE OF THE INVENTION

It is, therefore, an object of the invention made by focusing attention on the above problems to provide a production process of a connector preventing component atoms constituting a material and a substrate layer from diffusing into a tin-containing material layer and suppressing external force-type whiskers, and a connector produced by the same process.

Solution for the Task

As described in the first effect of the invention below, in a production process of a connector subjecting a material 70 to surface treatment comprising a step of providing a substrate layer 72 on a surface of the material 70 to surface treat the material 70 and a step of providing a tin-containing material layer 74 on an upside of the substrate layer 72 to surface treat the substrate layer 72, the above object can be achieved by further comprising a step of providing a barrier intermediate layer 76 for preventing component atoms constituting the material 70 and the substrate layer 72 from diffusing into the tin-containing material layer 74 and suppressing an occurrence of external force-type whiskers upon the application of external force to a surface of the tin-containing material layer 74 before the provision of the tin-containing material layer 74.

Also, as described in the second effect of the invention below, in a production process of a connector subjecting a material 70 to surface treatment comprising a step of providing a substrate layer 72 on a surface of the material 70 to surface treat the material 70 and a step of providing a tin-containing material layer 74 on an upside of the substrate layer 72 to surface treat the substrate layer 72, the above object can be achieved by further comprising a step of providing a barrier intermediate layer 76 as a surface treatment layer containing a substance easily generating a stable chemical compound with tin atoms for preventing tin atoms from diffusing in an interface between the substrate layer 72 and the tin-containing material layer 74 by generating the chemical compound of the tin atoms and the substance and suppressing an occurrence of external force-type whiskers upon the application of external force to a surface of the tin-containing material layer 74 before the provision of the tin-containing material layer 74.

The barrier intermediate layer 76 includes both the one provided on the entire surface of the substrate layer 72 and the one with metal particles of surface treatment dotted about in a mottled state on the substrate layer 72.

In the production process of a connector according to the first or second effect of the invention, the barrier intermediate layer 76 is a surface treatment layer containing a gold-containing material 761 and/or a palladium 765.

Moreover, in the production process of a connector according to the first or second effect of the invention, the barrier intermediate layer 76 has a deposited amount of surface treatment of not less than 0.01 mg/cm$^2$.

In the production process of a connector according to any one of the first or second effect of the invention described in the fifth effect of the invention below, the barrier intermediate layer 76 has a thickness of surface treatment of not less than 0.03 μm.

In the production process of a connector according to the first, second or fifth effect of the invention described in the sixth effect of the invention below, the barrier intermediate layer 76 is provided so as to have metal particles of surface treatment being dotted about in a mottled state on the substrate layer 72.

Moreover, in the production process of a connector according to the fifth or sixth effect of the invention described in the seventh effect of the invention below, when the gold-containing material 761 or a gold-containing material strike 766 is plated as the barrier intermediate layer 76, an intermetallic compound layer of tin and gold is formed in at least the interface portion of the tin-containing material layer 74.

Also, in the production process of a connector according to any one of the fifth to seventh effects of the invention described in the eighth effect of the invention below, the gold-containing material 761 is a pure gold or a gold group alloy.

Furthermore, a connector using a terminal of metal described in the ninth effect of the invention below prevents component atoms constituting a terminal material and the substrate layer 72 from diffusing into the tin-containing material layer 74 and tin atoms from diffusing in an interface between the substrate layer 72 and the tin-containing material layer 74 and suppresses an occurrence of external force-type whiskers upon, the application of external force to a surface of the tin-containing material layer 74 by first providing the substrate layer 72 on a surface of the terminal to surface treat the terminal, next providing the barrier intermediate layer 76 with a deposited amount of surface treatment of not less than 0.01 mg/cm$^2$, and lastly providing the tin-containing material layer 74.

Effect of the Invention

As is clear from the above description, according to the process for producing a connector and the connector produced by the same process of the invention, it is possible to obtain excellent and remarkable effects as follows.

(1) The first effect of the invention is that in a production process of a connector subjecting a material 70 to surface treatment comprising a step of providing a substrate layer 72 on a surface of the material 70 to surface treat the material 70 and a step of providing a tin-containing material layer 74 on an upside of the substrate layer 72 to surface treat the substrate layer 72, by further comprising a step of providing a barrier intermediate layer 76 for preventing component atoms constituting the material 70 and the substrate layer 72 from diffusing into the tin-containing material layer 74 and suppressing an occurrence of external force-type whiskers upon the application of external force to a surface of the tin-containing material layer 74 before the provision of the tin-containing material layer 74, it is possible to prevent the component atoms constituting the material 70 and the substrate layer 72 from diffusing into the tin-containing material layer 74 and suppress the diffusion of tin atoms so as to prevent coarsening of tin (Sn) crystal particles to thereby suppress the occurrence of whiskers.

(2) The second effect of the invention is that in a production process of a connector subjecting a material 70 to surface treatment comprising a step of providing a substrate layer 72 on a surface of the material 70 to surface treat the material 70 and a step of providing a tin-containing material layer 74 on an upside of the substrate layer 72 to surface treat the substrate layer 72, by further comprising a step of providing a barrier intermediate layer 76 as a surface treatment layer containing a substance easily generating a stable chemical compound with tin atoms for preventing tin atoms from diffusing in an interface between the substrate layer 72 and the tin-containing material layer 74 by generating the chemical compound of the tin atoms and the substance and suppressing an occurrence of external force-type whiskers upon the application of external force to a surface of the tin-containing material layer 74 before the provision of the tin-containing material layer 74, it is increasingly possible to prevent the component atoms constituting the material 70 and the substrate layer 72 from diffusing into the tin-containing material layer 74 and suppress the diffusion of tin atoms in the interface between nickel and tin-containing material plating by plating with a metal which easily generates a stable chemical compound with tin atoms (e.g. pure gold and gold group alloy) so as to prevent coarsening of tin (Sn) crystal particles to thereby suppress the occurrence of whiskers.

(3) In the production process of a connector according to the first or second effect of the invention, by having the barrier intermediate layer 76 as a surface treatment layer containing a gold-containing material 761 and/or a palladium 765, it is possible to prevent component atoms constituting the material 70 and the substrate layer 72 from diffusing into the tin-containing material layer 74 to thereby suppress the occurrence of whiskers. When the kind of the barrier intermediate layer 76 is the gold-containing material plating 761 or the palladium plating 765, it is possible to prevent component atoms constituting the material 70 and the substrate layer 72 from diffusing into the tin-containing material layer 74 and suppress the diffusion of tin atoms so as to prevent coarsening of tin (Sn) crystal particles (see the following FIG. 3 (A)).

Moreover, in the production process of a connector according to the second effect of the invention, by having the barrier intermediate layer 76 as a surface treatment layer containing a gold-containing material and/or a palladium which easily bonds to tin (Sn) and forms an intermetallic compound layer such as so-called tin-gold (Sn—Au) of tin, gold and copper and tin-palladium (Sn—Pd), it is increasingly possible to prevent the component atoms constituting the material 70 and the substrate layer 72 from diffusing into the tin-containing material layer 74 and suppress the diffusion of tin atoms in the interface between nickel and tin-containing material plating by plating with a metal which easily generates a stable chemical compound with tin atoms (e.g. pure gold and gold group alloy) so as to prevent coarsening of tin (Sn) crystal particles to thereby suppress the occurrence of whiskers.

(4) In the production process of a connector according to the first or second effect of the invention, by having the barrier intermediate layer 76 with a deposited amount of surface treatment of not less than 0.01 mg/cm$^2$, it is possible to prevent the component atoms constituting the material 70 and the substrate layer 72 from diffusing into the tin-containing material layer 74 and suppress the diffusion of tin atoms in the interface between nickel and tin-containing material plating by plating with a metal which easily generates a stable chemical compound with tin atoms (e.g. pure gold and gold group alloy) so as to prevent coarsening of tin (Sn) crystal particles to thereby suppress the occurrence of whiskers. When the deposited amount of the barrier intermediate layer 76 is 0.01 mg/cm$^2$, it is sufficiently possible to prevent the component atoms constituting the material 70 and the substrate layer 72 from diffusing into the tin-containing material layer 74 and suppress the diffusion of tin atoms in the interface between nickel and tin-containing material plating by plating with a metal which easily generates a stable chemical compound with tin atoms (e.g. pure gold and gold group alloy) so as to prevent coarsening of tin (Sn) crystal particles.

(5) In the production process of a connector according to the first or second effect of the invention, by having the barrier intermediate layer 76 with a thickness of surface treatment of not less than 0.03 μm, it is possible to prevent the component atoms constituting the material 70 and the substrate layer 72 from diffusing into the tin-containing material layer 74 and suppress the diffusion of tin atoms in the interface between nickel and tin-containing material plating by plating with a metal which easily generates a stable chemical compound with tin atoms (e.g. pure gold and gold group alloy) so as to prevent coarsening of tin (Sn) crystal particles to thereby suppress the occurrence of whiskers. When the thickness of the barrier intermediate layer 76 is 0.03 μm, it is sufficiently possible to prevent the component atoms constituting the material 70 and the substrate layer 72 from diffusing into the tin-containing material layer 74 (see the following FIG. 5) and suppress the diffusion of tin atoms in the interface between nickel and tin-containing material plating by plating with a metal which easily generates a stable chemical compound with tin atoms (e.g. pure gold and gold group alloy) so as to prevent coarsening of tin (Sn) crystal particles.

(6) The sixth effect of the invention is that in the production process of a connector according to the fifth or sixth effect of the invention, having the barrier intermediate layer 76 provided as metal particles of surface treatment being dotted about in a mottled state on the substrate layer 72, it is possible to prevent the component atoms constituting the material 70 and the substrate layer 72 from diffusing into the tin-containing material layer 74 to thereby suppress the occurrence of whiskers. When the kind of the barrier intermediate layer 76 with surface treatment being dotted about in a mottled state is gold-containing material strike plating 766 or palladium strike plating, it is sufficiently possible to prevent the component atoms constituting the material 70 and the substrate layer 72 from diffusing into the tin-containing material layer 74 (see the following FIG. 3 (B)).

(7) The seventh effect of the invention is that in the production process of a connector according to the fifth or sixth effect of the invention, by forming the intermetalilic compound layer of tin and gold in the interfacial portion of at least the tin-containing material layer 74 while the gold-containing material 761 or the gold-containing material strike 766 is plated as the barrier intermediate layer 76, since gold (Au) easily bonds with tin (Sn) in the tin-containing material layer 74 and forms a so-called tin-gold (Sn—Au) intermetalilic compound layer of tin and gold, it is increasingly possible to prevent the component atoms constituting the material 70 and the substrate layer 72 from diffusing into the tin-containing material layer 74 (see FIG. 6) and suppress the diffusion of tin atoms in the interface between nickel and tin-containing material plating by plating with a metal which easily generates a stable chemical compound with tin atoms (e.g. pure gold and gold group alloy) so as to prevent coarsening of tin (Sn) crystal particles to thereby suppress the occurrence of whiskers. FIG. 6 is a secondary ion (SIM) image in plating cross-section after focused ion beam (FIB) process after the gold-containing material plating 761 or the gold-containing material strike plating 766.

(8) The eighth effect of the invention is that in the production process of a connector according to any one of the fifth to seventh effects of the invention, by having the gold-containing material 761 of pure gold or gold group alloy, since gold (Au) easily bonds with tin (Sn) in the tin-containing material layer 74 and forms a so-called tin-gold (Sn—Au) intermetallic compound layer of tin and gold, it is increasingly possible to prevent the component atoms constituting the material 70 and the substrate layer 72 from diffusing into the tin-containing material layer 74 and suppress the occurrence of whiskers. The gold group alloy means an alloy containing 50% of gold (Au).

(9) The ninth effect of the invention is that in a connector using a terminal of metal, by first providing the substrate layer 72 on a surface of the terminal to surface treat the terminal, next providing the barrier intermediate layer 76 with a deposited amount of surface treatment of not less than 0.01 mg/cm$^2$, and lastly providing the tin-containing material layer 74 so as to prevent component atoms constituting a terminal material and the substrate layer 72 from diffusing into the tin-containing material layer 74 and tin atoms from diffusing in an interface between the substrate layer 72 and the tin-containing material layer 74 to thereby suppresses the occurrence of external force-type whiskers upon the application of external force to a surface of the tin-containing material layer 74, it is increasingly possible to prevent the component atoms constituting the material 70 and the substrate layer 72 from diffusing into the tin-containing material layer 74 to thereby suppress the occurrence of whiskers without creating a short circuit between adjacent terminals even with narrow space or a poor connection.

BRIEF DESCRIPTION OF THE DRAWINGS

FIG. 1(A) is a perspective view of a connector using a terminal subjected to surface treatment by a process for suppressing the occurrence of whiskers due to external force;

FIG. 1(B) is a perspective view of the connector in (A) in a state that a terminal is pulled out, and the terminal;

FIG. 1(C) is a cross-sectional view of a connector being cut in a certain terminal portion;

FIG. 3(A) is a view showing an occurrence state of whiskers when gold-containing material plating is used as a barrier intermediate layer;

FIG. 3(B) is a view showing an occurrence state of whiskers when gold-containing material strike plating is used as a barrier intermediate layer;

FIG. 4(A) is a view showing an occurrence state of whiskers when palladium plating is used as a barrier intermediate layer;

FIG. 4(B) is a view showing an occurrence state of whiskers when platinum plating is used as a barrier intermediate layer;

FIG. 4(C) is a view showing an occurrence state of whiskers when silver plating is used as a barrier intermediate layer;

FIG. 5(A) is a view showing an occurrence state of whiskers according to the thickness of gold-containing material plating when gold-containing material plating is used as a barrier intermediate layer;

FIG. 5(B) is a view showing a total length of whiskers according to the thickness difference of gold-containing material plating when external force is added;

FIG. 9(A) is a cross-sectional view (photograph) of a whisker occurrence portion observed in a cross-sectional direction;

FIG. 9(B) is an enlarged view (photograph) of X portion in (A);

FIG. 10(A) is an analysis result of point 1 in a state that copper and nickel are diffused;

FIG. 10(B) is an analysis result of point 2;

BEST MODE FOR CARRYING OUT THE INVENTION

Figure 2:
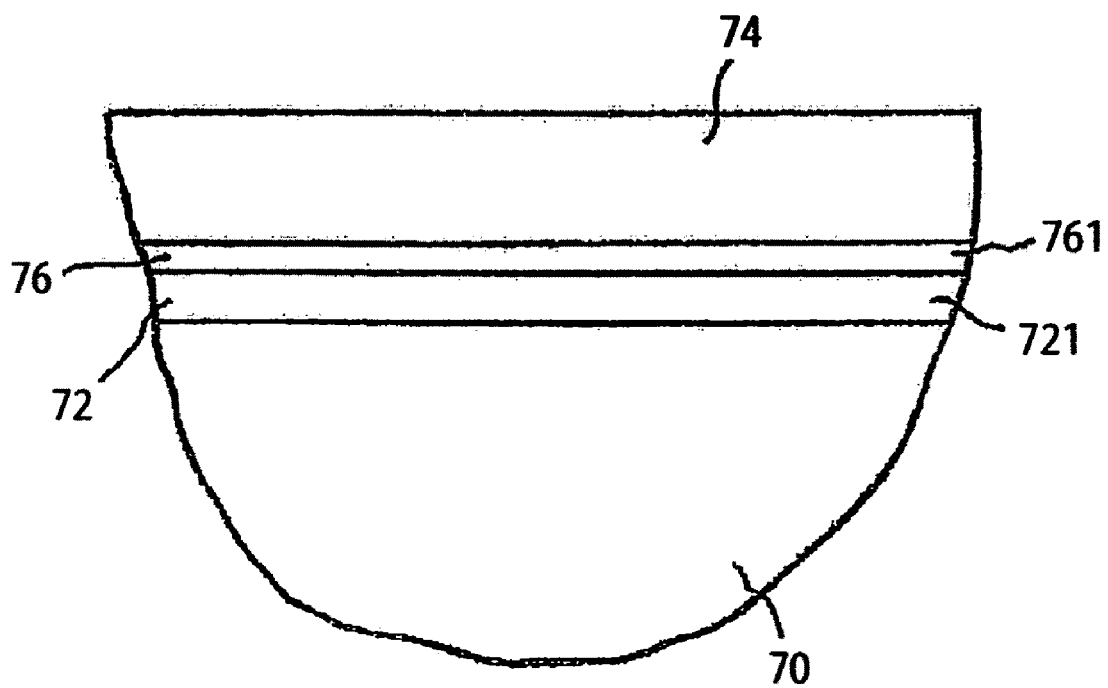
FIG. 2 is an enlarged cross-sectional view showing surface treatment of the invention in a portion of contact where external force is added.
Figure 6:
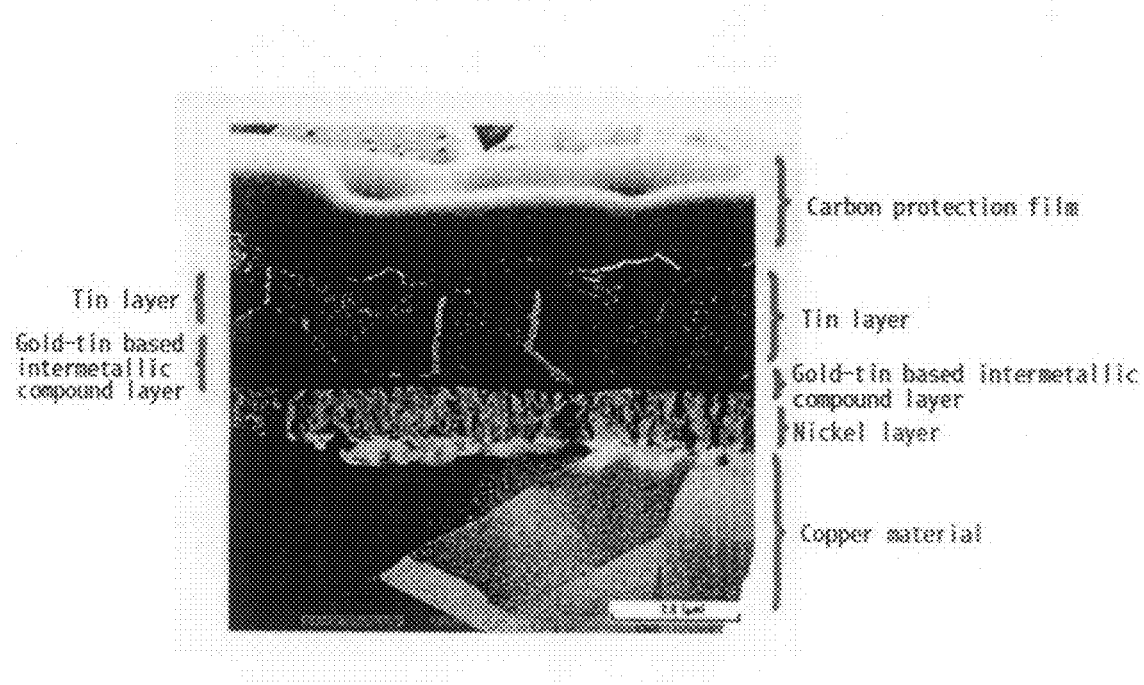
FIG. 6 is a secondary ion (SIM) image in a plating cross section after focused ion beam (FIB) process after gold-containing material plating or gold-containing material strike plating.
Figure 7:
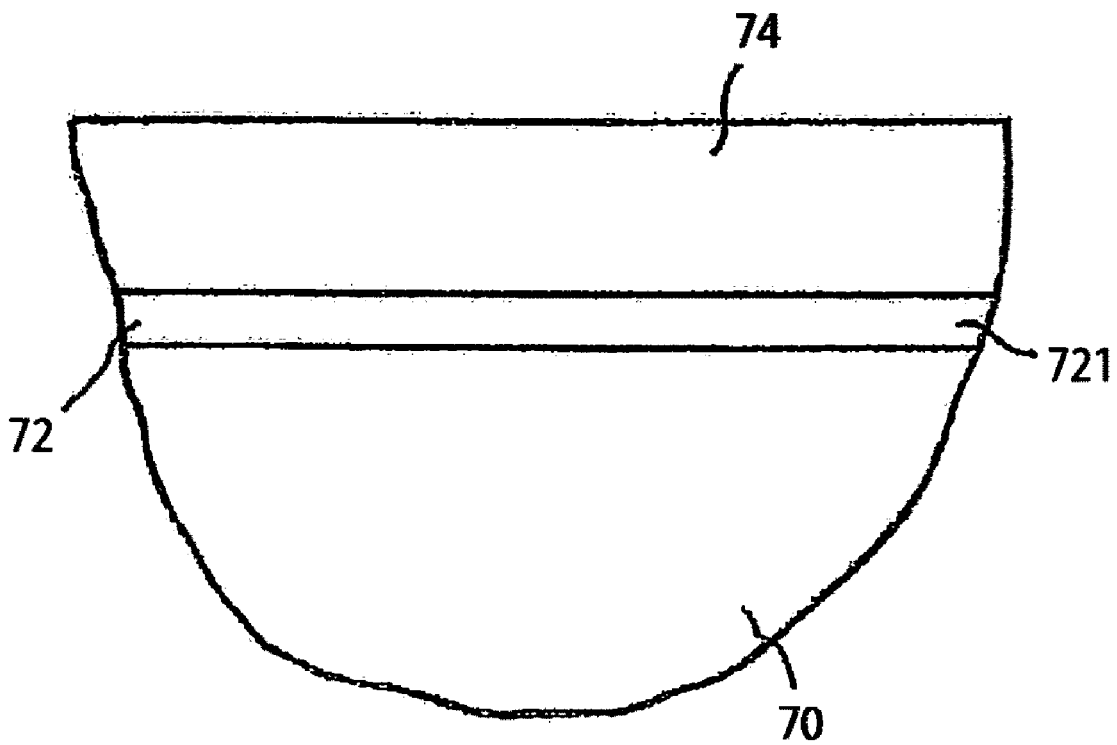
FIG. 7 is an enlarged cross-sectional view showing conventional surface treatment in a portion where external force is added.
Figure 8:
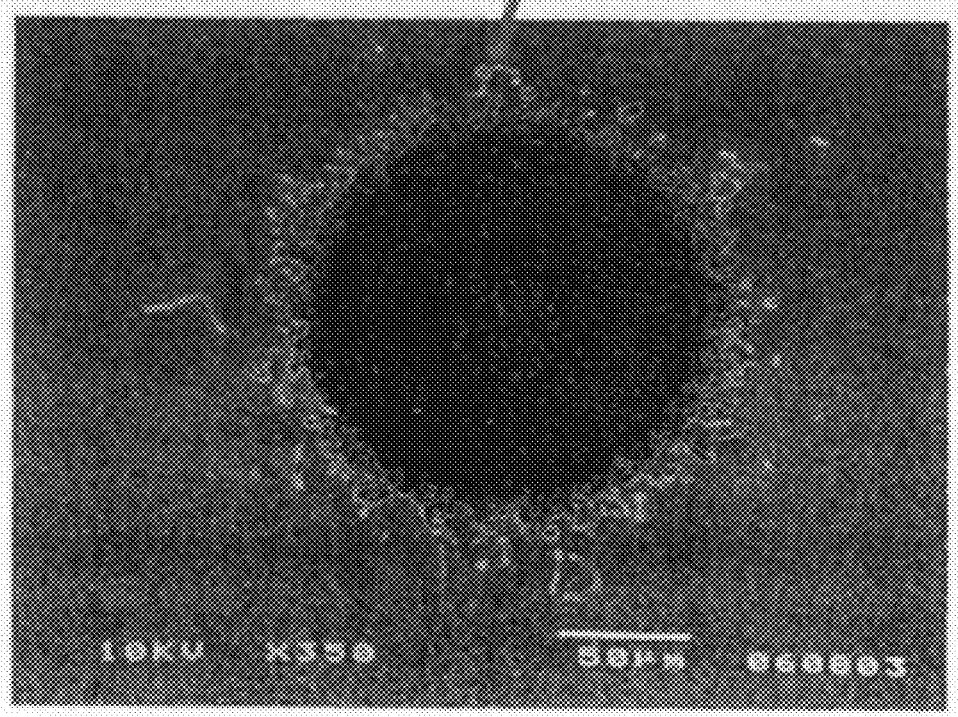
FIG. 8 is a view showing an occurrence state of whiskers in FIG. 7.
Figure 11:
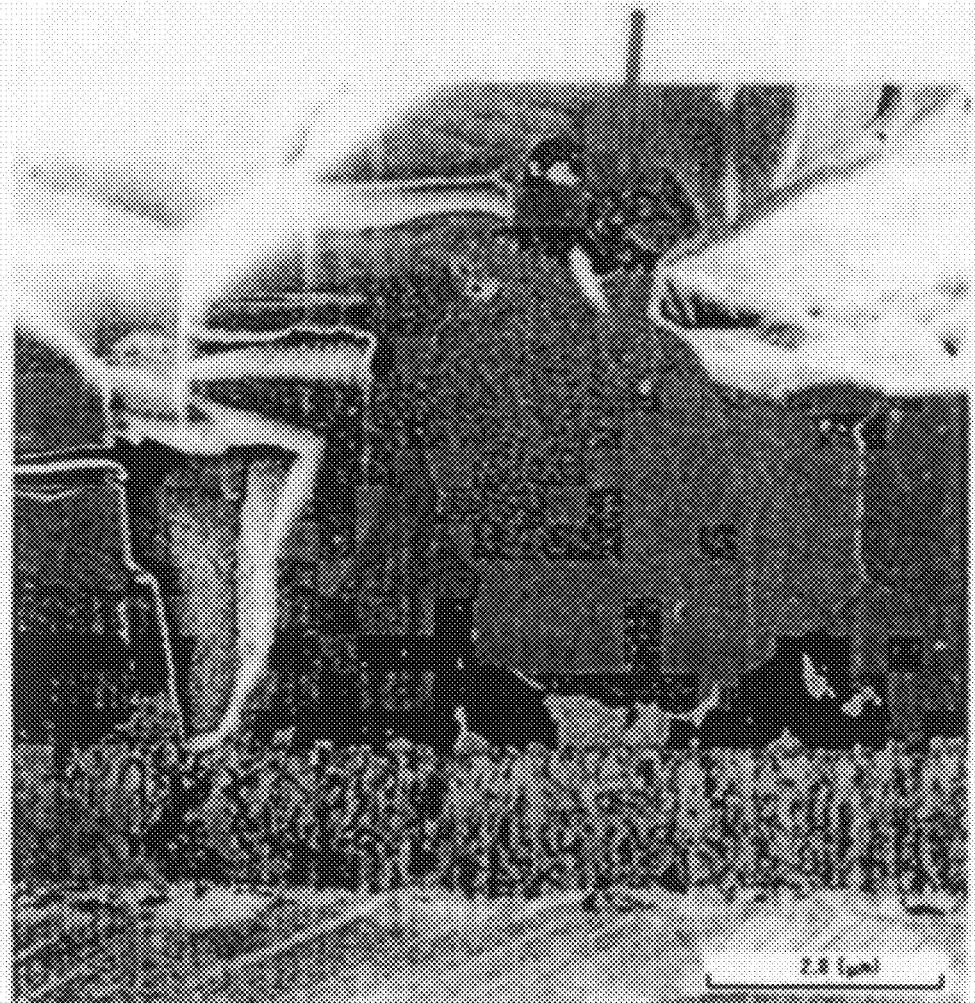
FIG. 11 is a secondary ion (SIM) image in plating cross section after focused ion beam (FIB) process in a whisker occurrence portion after adding external force on conventional surface treatment.

A process for suppressing external force-type whiskers of the invention will be described with reference to FIGS. 2 to 5 comparing to a conventional process. FIG. 2 is an enlarged cross-sectional view showing surface treatment of the invention in a portion of contact where external force is added. FIG. 3 (A) is a view showing an occurrence state of whiskers when gold-containing material plating is used as a barrier intermediate layer and (B) is a view showing an occurrence state of whiskers when gold-containing material strike plating is used as a barrier intermediate layer. FIG. 4 (A) is a view showing an occurrence state of whiskers when palladium plating is used as a barrier intermediate layer and (B) is a view showing an occurrence state of whiskers when platinum plating is used as a barrier intermediate layer. FIG. 5 (A) is a view showing an occurrence state of whiskers according to the thickness of gold-containing material plating when gold-containing material plating is used as a barrier intermediate layer and (B) is a view showing a total length of whiskers according to the thickness difference of gold-containing material plating when external force is added. FIG. 6 is a secondary ion (SIM) image in a plating cross section after focused ion beam (FIB) process after the gold-containing material plating or the gold-containing material strike plating.

As stated above (and shown in FIG. 9), it is clear that diffusion of atoms of the material 70 and the substrate layer 72 into the tin-containing material layer 74 furthers the growth of whiskers. So, the inventors have thought of applying the barrier intermediate layer 76 between the substrate layer 72 and the tin-containing material layer 74 for preventing atoms of the material 70 and the substrate layer 72 from diffusing into the tin-containing material layer 74. Therefore, as FIG. 2, 1.0 to 2.0 µm of the substrate layer surface treatment 72 (nickel plating 721) is subjected to the material 70 (copper alloy), 0.03 to 0.1 µm of the barrier intermediate layer 76 (gold plating 761) is provided thereon, and lastly 2.0 to 3.0 µm of tin-containing material layer is provided to prepare a sample 1. Moreover, a sample 1-1 is prepared by applying a gold-containing material strike plating 766 as a substitute of the gold-containing material plating 761.

As a result of adding external force to the above sample 1 by the zirconia simplified load test method and observing an occurrence state of whiskers, it is found that by applying the gold-containing material plating 761 as the barrier intermediate layer 76 directly under the tin-containing material layer 74, the occurrence of whiskers can be suppressed as in FIG. 3(B). The gold-containing material here means pure gold or gold group alloy (containing not less than 50% of gold).

The inventors have made similar attempts for palladium 765, platinum 762 and silver 767. A sample 2 is prepared by applying platinum plating 762 as the barrier intermediate layer 76, a sample 4 is prepared by applying palladium plating 765, and a sample 8 is prepared by applying silver plating 767. Results of adding external force to each sample by the zirconia simplified load test method and observing the occurrence state of whiskers are shown in FIG. 4. As shown in FIG. 4 (A), an effect of suppressing the occurrence of whiskers is seen in the palladium 765. On the other hand, as shown in FIGS. 4(B) and (C), the effect of suppressing the occurrence of whiskers is not seen in the platinum 762 (FIG. 4(B)) or the silver 767 (FIG. 4(C)).

As seen from the results of FIGS. 3 and 4, the gold-containing material plating 761 or the gold-containing material strike plating 766 is preferable as the barrier intermediate layer 76 for preventing the occurrence of whiskers. In the case of the gold-containing material plating 761 or the gold-containing material strike plating 766, as show in FIG. 6, since gold (Au) easily bonds with tin (Sn) in the tin-containing material layer 74 and forms an intermetallic compound layer of tin (Sn) and gold (Au), it results in increasingly preventing the component atoms constituting the material 70 and the substrate layer 72 from diffusing into the tin-containing material layer 74 and suppressing the occurrence of whiskers.

Figure 12:
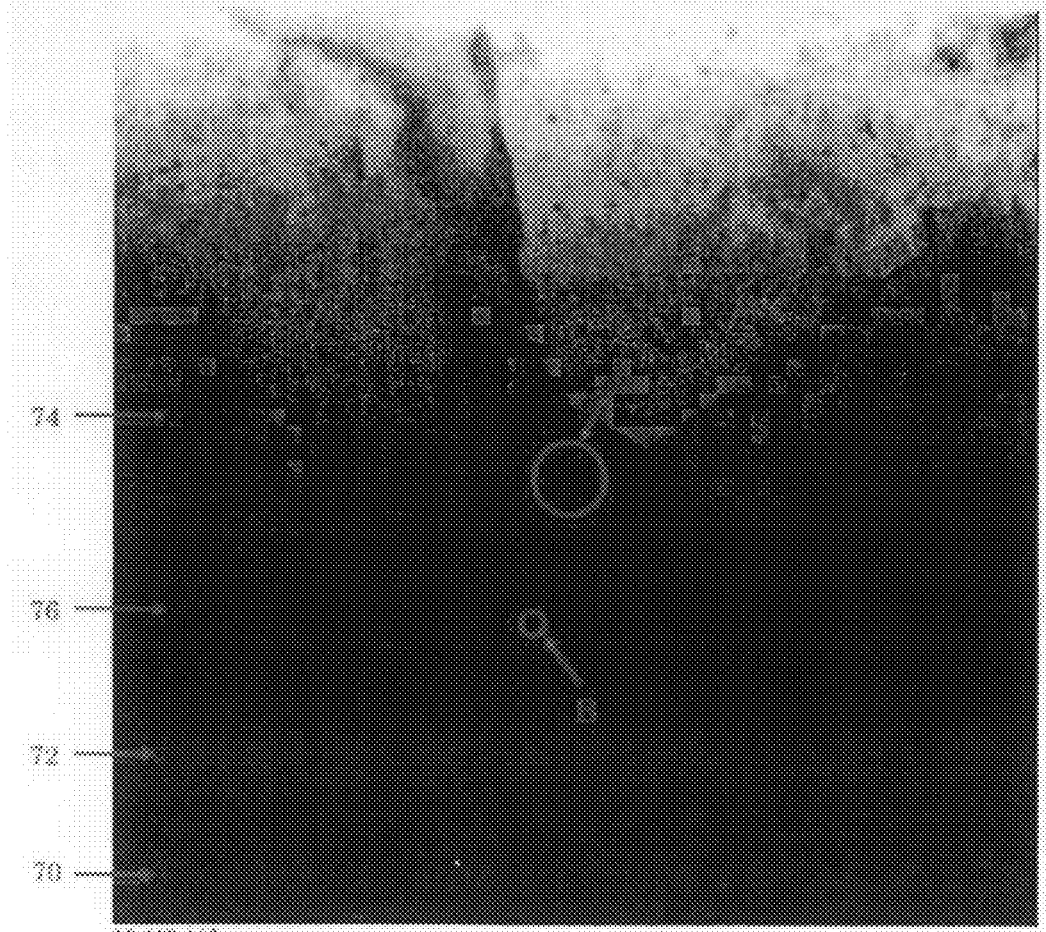
FIG. 12 is a photograph of a partial cross section of a connector produced by forming a substrate layer of Ni, a barrier intermediate layer of Au-containing material plating and tin-containing material layer in order on a material of Cu, when it is observed by enlarging with transmission electron microscope (TEM)
Figure 13:
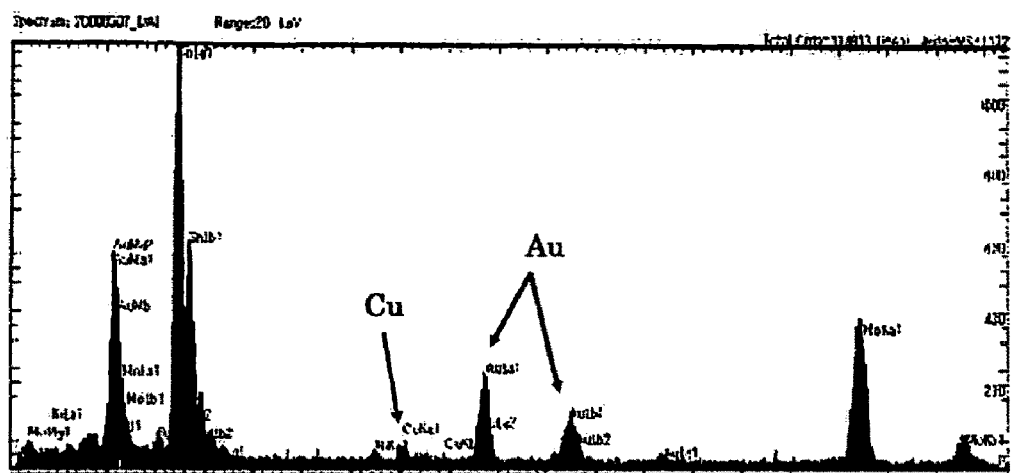
FIG. 13(A) shows a peak of a diffraction line obtained by analyzing a portion (area A) of an intermetallic compound layer in FIG. 12 with an energy dispersive X-ray spectroscopic analyzer (EDS)
FIG. 13(B) is a table showing the distribution of each element obtained by conducting a semi-Quantitative analysis on the area A with an energy dispersive X-ray spectroscopic analyzer (EDS).
Figure 14:
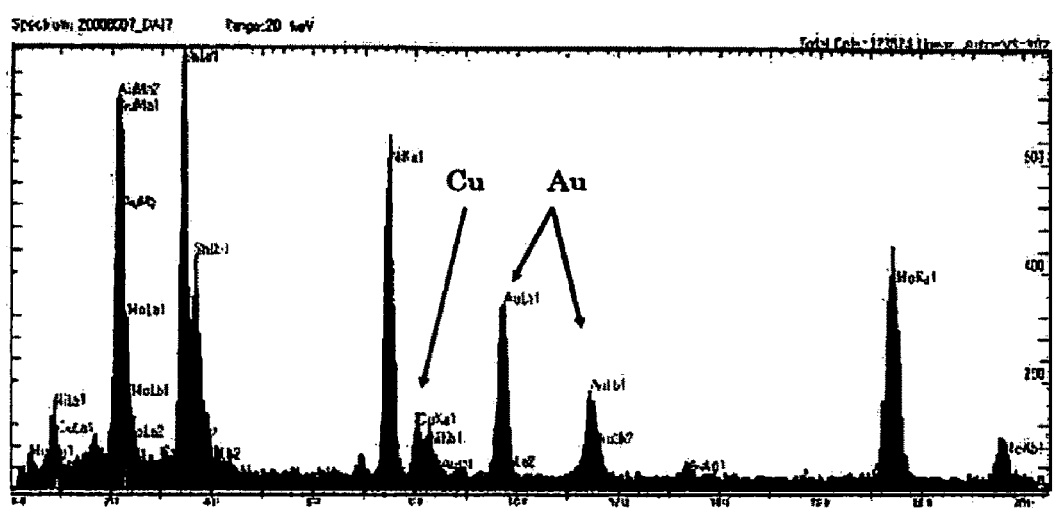

Here, FIG. 12 is a photograph (bright field image) of a partial cross section of a connector produced by forming the substrate layer 72 of Ni on the material 70 of Cu, forming the barrier intermediate layer 76 of Au-containing material plating on the substrate layer 72, and forming the tin-containing material layer 74 on the barrier intermediate layer 76, when it is observed by enlarging with a transmission electron microscope (TEM). As shown in FIG. 12, it is seen that an intermetallic compound layer is formed between the barrier intermediate layer 76 and the tin-containing material layer 74. Then, a spectrum obtained by analyzing a portion of the intermetallic compound layer (area A in FIG. 12) with an energy dispersive X-ray spectroscopic analyzer (EDS) is shown in FIG. 13(A). As a peak of Au and Sn is seen in the result shown in FIG. 13 (A), it is clear that an Au—Sn intermetallic compound is formed in the portion of the intermetallic compound layer. It is also found that the Au—Sn intermetallic compound is $AuSn_4$ (intermetallic compound layer 1) from a table showing the distribution of each element in FIG. 13(B). Moreover, it is clear that $AuSn_2$ (intermetallic compound layer 1) exists between the substrate layer 72 (Ni) and the intermetallic compound layer 1 (area B) from the spectrum (FIG. 14(A)) obtained by EDS and the distribution of each element (FIG. 14(B)). It is thought that when Au and Sn react with each other, $AuSn_2$ as a metastable phase is formed first and $AuSn_4$ as a stable phase is formed next.

Thereafter, it is determined how much the gold-containing material plating 761 applied has an effect of suppressing the occurrence of whiskers. Samples of the gold-containing material plating 761 with varied thicknesses such as a sample 5 with a thickness of 0.03 μm, a sample 6 with a thickness of 0.05 μm and a sample 7 with a thickness of 0.1 μm are prepared. Results of adding external force to each sample by the zirconia simplified load test method and observing the occurrence state of whiskers are shown in FIG. 5(A). Criteria of determination are ○ for good, Δ for neutral and x for bad. As seen from FIG. 5(B), it is clear that the barrier intermediate layer 76 with a greater thickness can suppress the occurrence of whiskers more. FIG. 5(B) shows a total length of whiskers when external force is added.

It is clarified that applying at least 0.03 μm of the gold-containing material plating 761 as the barrier intermediate layer 76 can suppress the occurrence of whiskers.

While the above thickness of 0.03 μm is the limit of measurable thickness, it is also known that a gold-containing material strike with surface treatment being dotted about in a mottled state has an effect of suppressing the occurrence of whiskers as shown in FIG. 3(B). The limit of the deposited amount (mg/cm$^2$) of the sample 1-1 is measured as 0.01 mg/cm$^2$.

As seen from the above results, by providing the barrier intermediate layer 76 under the tin-containing material layer 74, it is possible to suppress the occurrence of external force-type whiskers. More specifically, by providing the barrier intermediate layer 76 with a thickness of at least 0.03 μm as measurable minimum, the diffusion of atoms of the material 70 and the substrate layer surface treatment 72 into the tin-containing material layer 74 is prevented. In consideration of the suppression of whiskers, cost, and solder wettability, the thickness is preferably 0.03 to 0.1 μm. Moreover, by providing the barrier intermediate layer 76 with a deposited amount of at least 0.01 mg/cm$^2$ as measurable minimum (including the case of plating being dotted about), the diffusion of atoms of the material 70 and the substrate layer surface treatment 72 into the tin-containing material layer 74 is prevented.

As shown in FIG. 6, in the case of the gold-containing material plating 761 or the gold-containing material strike plating 766, since gold (Au) is easily bonds with tin (Sn) of the tin-containing material layer 74 and forms an intermetallic compound layer of tin (Sn) and gold (Au), it results in increasingly preventing the component atoms constituting the material 70 and the substrate layer 72 from diffusing into the tin-containing material layer 74 and suppressing the occurrence of whiskers. FIG. 6 is a secondary ion (SIM) image in a plating cross section after focused ion beam (FIB) process after the gold-containing material plating 761 or the gold-containing material strike plating 766.

A connector as a connector using the above process for suppressing external force-type whiskers will be described below.

FIG. 1(A) is a perspective view of a connector using a terminal subjected to surface treatment by a process for suppressing the occurrence of whiskers due to external force, (B) is a perspective view of the connector in (A) with a terminal pulled out and the terminal, and (C) is a cross-sectional view of a connector being cut in a certain terminal portion.

A connector of the example mainly comprises a housing 12, a rotary member 18 and terminals 14.

First, the terminal 14 will be described based on FIG. 1. The terminal 14 is produced of metal by a well-known press working. Since springiness and conductive property are required, brass, beryllium copper, phosphor bronze and the like as copper alloys can be cited as a material of the terminal 14.

A portion where load as external force is added in the terminal 14, as shown in FIG. 1(C), a portion where A portion contacting with FPC 64, B portion pressed by a pressing portion 54 of the rotary member 18 and a portion where the terminal 14 are pressed into the housing 12. As described above, in at least these portions where load as external force is added, the barrier intermediate layer 76 needs to be provided under the tin-containing material layer 74. In the example, the nickel plating 721 as the substrate layer surface treatment 72 is applied to phosphor bronze as the material 70, the gold-containing material plating 761 (containing approximately 0.3% of cobalt (Co) other than gold here) as the barrier intermediate layer 76 is applied thereto, and lastly the tin-containing material layer 74 is provided entirely rather than partially considering the steps.

The terminal 14 has a fallen substantially H shape and comprises at least a contact portion 26 (upside of FIG. 1(B)) contacting with the FPC 64, connecting portion 40 connecting with a board and the like, a fixed portion 38 being fixed to the housing 12 and a press receiving portion 32 being pressed by a coupling support point portion 30 and a rotary member 18. The contact portion 26 and the press receiving portion 32 are provided in the both ends of a first piece 22 of plate-like pieces, a projecting portion 42 projecting inward is provided in the tip of the press receiving portion 32, a second piece 24 having an extension portion 36 extending in the facing direction of the contact portion 26 in one end and a connecting portion 40 connecting with a board in an object is provided, and the first piece 22 and the second piece 24 are coupled by the coupling support point portion 30 in the vicinity of substantially middle. The contact portion 26, the coupling support point portion 30, the connecting portion 40 are arranged in a substantially crank shape and the pressing portion 54 of the rotary member 18 is adapted to rotate between the press receiving portion 32 and the connecting portion 40.

The position arrangement of the connecting portion 40 is designed accordingly considering landing position of the board, patterning position of the board, narrow space and the like. In the example, the connecting portion 40 of the terminal 14 is provided in the facing side of the press receiving portion 32. The contact portion 26 has a protrusion shape for easily contacting with the FPC 64, and although the connecting portion 40 is a surface mount type (SMT) as FIG. 1 in the example, it may be a DIP type. Another contact portion 26 may also be provided in the facing side of the contact portion 26 according to specification of the FPC 64. More specifically, 2 contact portions 26 and 26 may be provided to pinch the FPC 64.

When the FPC 64 is inserted, the coupling support point portion 30 and the press receiving portion 32 carry out functions as follows. After the FPC 64 is inserted into a socket 20 of the housing 12, the pressing portion 54 of the rotary member 18 rotates between the connecting portion 40 and the press receiving portion 32 of the terminal 14, the press receiving portion 32 is pressed up by the pressing portion 54, the upper end of the coupling support point portion 30 of the terminal 14 is trended toward the contact portion 26 side with a support point of the lower end of the coupling support point portion 30 of the terminal 14 (downside of FIG. 1(C)), and the contact portion 26 is pressed toward the FPC 64 side. The size and shape of the coupling support point portion 30 and the press receiving portion 32 are designed accordingly for carrying out these functions. Also, when the pressing portion 54 of the rotary member 18 is rotated between the press receiving portion 32 and the connecting portion 40 of the terminal 14, it is preferable to provide the projecting portion 42 in the tip of the press receiving portion 32 of the terminal 14 and engage it with an engaging hole 58 of the rotary member 18 so as to resist the strong repulsion of the rotary member 18 against rotation. The projecting portion 42 may have any size as long as it can fulfill such a role, so it is designed accordingly so that the engaging hole of the rotary member 18 hooks into it.

Next, the rotary member 18 will be described. Although a material of the rotary member 18, which is produced of electric insulating plastic by injection molding as a well-known technique, is selected accordingly in consideration of dimensional stability, workability, cost and the like, polybutylene terephthalate (PBT), polyamide (66PA, 64PA), liquid crystalline polymer (LCP), polycarbonate (PC), and synthetic material thereof can generally be cited.

The rotary member 18 mainly comprises a shaft portion being rotatably mounted on the housing 12, the pressing portion 54 pressing the press receiving portion 32 of the terminal 14, the engaging hole 58 engaging with the projecting portion 42 of the terminal 14 and the operating portion 56. The shaft is a support point for rotating the rotary member 18, accordingly mounted on both sides of the housing 12 in a longitudinal direction so that the rotary member 18 is rotable, and in the relationship between the shaft and a bearing portion of the housing 12, a clearance is provided so that a rotary shaft 72 varies while the pressing portion 54 rotates as described above. Also, a locking portion engaging with the housing 12 is provided on the both sides in a longitudinal direction so that the rotary member 18 is not lifted up in a height (top of the drawing) direction while the press receiving portion 32 of the terminal 14 is pressed. The locking portion may have any size, shape and the like as long as it can engage with the housing 12, so it is designed accordingly considering the above role, the size of a connector 10, strength and the like.

The shape of the pressing portion 54 of the rotary member 18, which is a portion being pressed to the press receiving portion 32 of the terminal 14, is preferably an elongated shape, and an elliptical shape in the example. By rotating the pressing portion 54 having the elliptical shape between the press receiving portion 32 and the connecting portion 40 of the terminal 14, the press receiving portion 32 of the terminal 14 is lifted up according to the varying size of the pressing portion 54, and the FPC 64 is pressed toward the contact portion 26 of the terminal 14. The pressing portion 54 may have any shape as long as it can rotate between the press receiving portion 32 and the connecting portion 40 of the terminal 14 and lift the press receiving portion 32 of the terminal 14 according to the difference of size such as long shaft or short shaft. The size and shape of the pressing portion 54 is accordingly designed considering such things. Also, the operating portion 56 is provided in the rotary member 18 considering operability.

Since repulsion of the rotary member 18 against the rotation is strong while the rotary member 18 is rotated, the engaging hole 58 for engaging with the projecting portion 42 of the terminal 14 is provided separately. By providing the engaging hole 58 separately, strength of the rotary member 18 is enhanced and deformation while rotated is prevented.

The rotary member 18 described above is rotatably mounted on the opposite side of the socket 20 of the housing 12 (connecting portion side of the terminal 14).

Lastly, the housing 12 will be described. Although a material of the housing 12, which is produced of electric insulating plastic by injection molding as a well-known technique, is selected accordingly in consideration of dimensional stability, workability, cost and the like, polybutylene terephthalate (PBT), polyamide (66PA, 64PA), liquid crystalline polymer (LCP), polycarbonate (PC), and synthetic material thereof can generally be cited.

A required number of insertion recesses 48 to have the terminal 14 mounted thereon are provided in the housing 12, and fixed by press fitting, lance, welding and the like. Also, the socket 20 to have the FPC 64 inserted is provided in the housing 12, and the size of the socket 20 is designed accordingly so that the FPC 64 can be inserted and the rotary portion 18 can press the inserted FPC 64 toward the terminal 14. The bearing portion where the shaft of the rotary member 18 is rotatably mounted is provided on the both sides of the housing 12 in a longitudinal direction. In the relationship between the shaft and the bearing, a clearance is provided so that a compact rotation of the pressing portion 54 of the rotary member 18 is possible as mentioned above. The bearing portion may have any shape and size as long as it is mounted so that the shaft of the rotary member 18 can rotate and the compact rotation of the pressing portion 54 is possible, so is accordingly designed in consideration of the role, strength and size of the housing 12 and the like.

A ceiling portion 50 covering the contact portion 26 of the terminal 14 is provided in the housing 12. The ceiling portion 50 is to enhance dust resistance, and the size and shape are accordingly designed in consideration of the role, strength of the housing 12, rotatability and strength of the rotary member 18 and the like.

INDUSTRIAL APPLICABILITY

The invention utilized in a connector using a terminal of metal for use within electric instruments and electronic devices makes it possible to provide a process for suppressing the occurrence of whiskers upon the application of external force, particularly when the terminal of metal for use in the connector is subjected to surface treatment.

The invention claimed is:

1. A process for producing a connector comprising a step of providing a substrate layer on a surface of a material of terminals to surface treat the material and a step of providing a tin-containing material layer on an upside of the substrate layer to surface treat the substrate layer, wherein a step of providing a barrier intermediate layer for preventing component atoms constituting the material and the substrate layer from diffusing into the tin-containing material layer and suppressing an occurrence of external force-type whiskers upon an application of an external force to a surface of the tin-containing material layer is further comprised before the providing of the tin-containing material layer, and the barrier intermediate layer is a surface treatment layer containing gold-containing material and/or palladium and has a deposited amount of surface treatment of not less than 0.01 mg/cm$^2$, wherein an intermetallic compound layer of tin and gold is formed in at least an interfacial portion of the tin-containing material layer when a gold-containing material or a gold-containing material strike is plated.

2. The process for producing the connector according to claim 1, wherein the barrier intermediate layer has a thickness of surface treatment of not less than 0.03 μm.

3. The process for producing the connector according to claim 2, wherein the gold-containing material is pure gold or gold group alloy.

4. The process for producing the connector according to claim 2, wherein the barrier intermediate layer is provided to have metal particles of surface treatment being dotted about in mottled state on the substrate layer.

5. The process for producing the connector according to claim 1, wherein the barrier intermediate layer is provided to have metal particles of surface treatment being dotted about in mottled state on the substrate layer.

6. The process for producing the connector according to claim 2, wherein the intermetallic compound of tin and gold is AuSn$_2$ and/or AuSn$_4$.

7. The process for producing the connector according to claim 6, wherein the gold-containing material is pure gold or gold group alloy.

8. The process for producing the connector according to claim 5, wherein the intermetallic compound of tin and gold is AuSn$_2$ and/or AuSn$_4$.

9. The process for producing the connector according to claim 5, wherein the gold-containing material is pure gold or gold group alloy.

10. A process for producing a connector comprising a step of providing a substrate layer on a surface of a material of terminals to surface treat the material and a step of providing a tin-containing material layer on an upside of the substrate layer to surface treat the substrate layer, wherein a step of providing a barrier intermediate layer as a surface treatment layer containing a substance generating a stable chemical compound with tin atoms for preventing tin atoms from diffusing in an interface between the substrate layer and the tin-containing material layer by generating the stable chemical compound of the tin atoms and the substance and suppressing an occurrence of external force-type whiskers upon an application of an external force to a surface of the tin-containing material layer is further comprised before the providing of the tin-containing material layer, and the barrier intermediate layer is a surface treatment layer containing gold-containing material and/or palladium and has a deposited amount of surface treatment of not less than 0.01 mg/cm$^2$, wherein an intermetallic compound layer of tin and gold is formed in at least an interfacial portion of the tin-containing material layer when a gold-containing material or a gold-containing material strike is plated.

11. The process for producing the connector according to claim 10, wherein the barrier intermediate layer is provided to have metal particles of surface treatment being dotted about in mottled state on the substrate layer.

12. The process for producing the connector according to claim 11, wherein the intermetallic compound of tin and gold is AuSn$_2$ and/or AuSn$_4$.

13. The process for producing the connector according to claim 11, wherein the gold-containing material is pure gold or gold group alloy.

14. The process for producing the connector according to claim 10, wherein the barrier intermediate layer has a thickness of surface treatment of not less than 0.03 μm.

15. The process for producing the connector according to claim 14, wherein the intermetallic compound of tin and gold is AuSn$_2$ and/or AuSn$_4$.

16. The process for producing the connector according to claim 15, wherein the gold-containing material is pure gold or gold group alloy.

17. The process for producing the connector according to claim 14, wherein the gold-containing material is pure gold or gold group alloy.

18. The process for producing the connector according to claim 14, wherein the barrier intermediate layer is provided to have metal particles of surface treatment being dotted about in mottled state on the substrate layer.

19. A connector using a terminal of metal capable of preventing component atoms constituting a terminal material and a substrate layer from diffusing into a tin-containing material layer and tin atoms from diffusing in an interface between the substrate layer and the tin-containing material layer to thereby suppress an occurrence of external force-type whiskers upon an application of an external force to a surface of the tin-containing material layer, by first providing the substrate layer on a surface of the terminal to surface treat the terminal, next providing the barrier intermediate layer with a deposited amount of surface treatment of not less than 0.01 mg/cm$^2$, and lastly providing the tin-containing material layer, wherein an intermetallic compound layer of tin and gold is formed in at least an interfacial portion of the tin-containing material layer when a gold-containing material or a gold-containing material strike is plated.

* * * * *